(12) United States Patent
Song et al.

(10) Patent No.: US 8,008,855 B2
(45) Date of Patent: Aug. 30, 2011

(54) ORGANIC LIGHT EMITTING DISPLAY WITH MICRO-LENSES AND METHOD OF MANUFACTURING THE SAME

(75) Inventors: Young-Rok Song, Yongin-si (KR); Beohm-Rock Choi, Seoul (KR); Seong-Ho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 12/415,161

(22) Filed: Mar. 31, 2009

(65) Prior Publication Data

US 2010/0060149 A1    Mar. 11, 2010

(30) Foreign Application Priority Data

Sep. 11, 2008   (KR) .................. 10-2008-0089985

(51) Int. Cl.
*H01J 1/62* (2006.01)
*H01J 63/04* (2006.01)

(52) U.S. Cl. ......... 313/504; 313/498; 313/506; 313/512

(58) Field of Classification Search ........... 313/498–512
See application file for complete search history.

(56) References Cited

U.S. PATENT DOCUMENTS

| | | | |
|---|---|---|---|
| 2006/0158095 A1* | 7/2006 | Imamura | 313/500 |
| 2006/0273712 A1* | 12/2006 | Yaegashi | 313/503 |
| 2007/0085484 A1* | 4/2007 | Hsu | 315/169.2 |
| 2008/0018231 A1* | 1/2008 | Hirakata | 313/498 |
| 2009/0284128 A1* | 11/2009 | Shinohara et al. | 313/498 |

FOREIGN PATENT DOCUMENTS

| | | |
|---|---|---|
| JP | 2004-047298 | 2/2004 |
| KR | 1020050042592 | 5/2005 |
| KR | 1020060114086 | 11/2006 |
| KR | 1020070049223 | 5/2007 |

* cited by examiner

*Primary Examiner* — Bumsuk Won
*Assistant Examiner* — Kevin Quarterman
(74) *Attorney, Agent, or Firm* — F.Chau & Associates, LLC

(57) ABSTRACT

An organic light emitting display includes a base substrate, a driving transistor arranged on the base substrate, a first electrode electrically connected to the driving transistor, an organic light emitting layer arranged on the first electrode to generate a light, a second electrode arranged on the organic light emitting layer, an opposite substrate facing the base substrate and including micro-lenses to disperse the light generated by the organic light emitting layer, and a sub-electrode arranged on at least one of the micro-lenses, the sub-electrode making contact with the second electrode to be electrically connected to the second electrode.

9 Claims, 6 Drawing Sheets

ORGANIC LIGHT EMITTING DISPLAY WITH MICRO-LENSES AND METHOD OF MANUFACTURING THE SAME

CROSS-REFERENCE TO RELATED APPLICATION

This application claims priority to Korean Patent Application No. 2008-89985, filed on Sep. 11, 2008, the disclosure of which is incorporated by reference in its entirety herein.

BACKGROUND

1. Technical Field

Embodiments of the present invention relate to an organic light emitting display having an improved display quality and a method of manufacturing the organic light emitting display.

2. Discussion of Related Art

An organic light emitting display may include an organic light emitting layer, an upper electrode arranged on the organic light emitting display, and a lower electrode arranged under the organic light emitting display. The organic light emitting layer emits light using a current provided through the upper electrode and the lower electrode, and displays an image using the light.

However, the display quality of the organic light emitting display may be reduced when less than an optimum amount of light exits the display after passing through the upper electrode. One conventional method of improving display quality makes use of a thinner upper electrode. For example, in a top emission type organic light emitting display, the upper electrode may be formed to be thin enough to maximize the amount of light exiting to an exterior after passing through the upper electrode. However, the electrical conductivity of the upper electrode may deteriorate because the thinner upper electrode causes an increased electrical resistance, thereby decreasing the quality of the display.

Thus, there is a need for organic light emitting displays and methods of manufacturing such, which can make use of a thinner upper electrode while preventing or reducing the associated deterioration in display quality.

SUMMARY

An exemplary embodiment of the present invention includes an organic light emitting display. The organic light emitting display includes a base substrate, a driving transistor arranged on the base substrate, a first electrode electrically connected to the driving transistor, an organic light emitting layer arranged on the first electrode to generate a light, and a second electrode arranged on the organic light emitting layer.

The organic light emitting display includes an opposite substrate facing the base substrate and including micro-lenses to disperse the light generated by the organic light emitting layer, and a sub-electrode arranged on at least one of the micro-lenses. The sub-electrode makes contact with the second electrode to be electrically connected to the second electrode.

An exemplary embodiment of the present invention includes an opposing substrate for a display substrate of an organic light emitting display. The opposing substrate includes a transparent substrate and a plurality of sub-electrodes. One surface of the transparent substrate includes a first plurality of lenses disposed to face respective pixel areas of the display substrate and a second plurality of lenses disposed to face respective spaces between the pixel areas. The plurality of sub-electrodes makes contact with and covers a part of a respective one of the second plurality of lenses. The sub-electrodes are configured to make an electrical connection with a transparent conductive material of the display substrate.

An exemplary embodiment of the present invention includes a method of manufacturing an organic light emitting display. The method includes forming a driving transistor on a base substrate, forming a first electrode to be electrically connected to the driving transistor, forming an organic light emitting layer on the first electrode, forming a second electrode on the organic light emitting layer, forming an opposite substrate having micro-lenses and a sub-electrode, and coupling the base substrate with the opposite substrate such that the sub-electrode makes contact with the second electrode.

According to an exemplary embodiment of the present invention, a first electrode, an organic light emitting layer, and a second electrode are arranged on a base substrate, and micro-lenses are arranged on an opposite substrate. The micro-lenses disperse light that is emitted by the organic light emitting layer and exits to an exterior after passing through the opposite substrate, thereby preventing brightness of the organic light emitting display from varying according to a viewing angle. The micro-lenses may serve as a spacer that maintains a distance between the base substrate and the opposite substrate. The sub-electrode formed on the micro-lenses may be electrically connected to the second electrode.

BRIEF DESCRIPTION OF THE DRAWINGS

Embodiments of the present invention will become readily apparent by reference to the following detailed description when considered in conjunction with the accompanying drawings wherein.

DESCRIPTION OF EXEMPLARY EMBODIMENTS

It will be understood that when an element or layer is referred to as being "on", "connected to" or "coupled to" another element or layer, it can be directly on, connected or coupled to the other element or layer or intervening elements or layers may be present. Hereinafter, exemplary embodiments of the present invention will be explained in detail with reference to the accompanying drawings.

Figure 1:
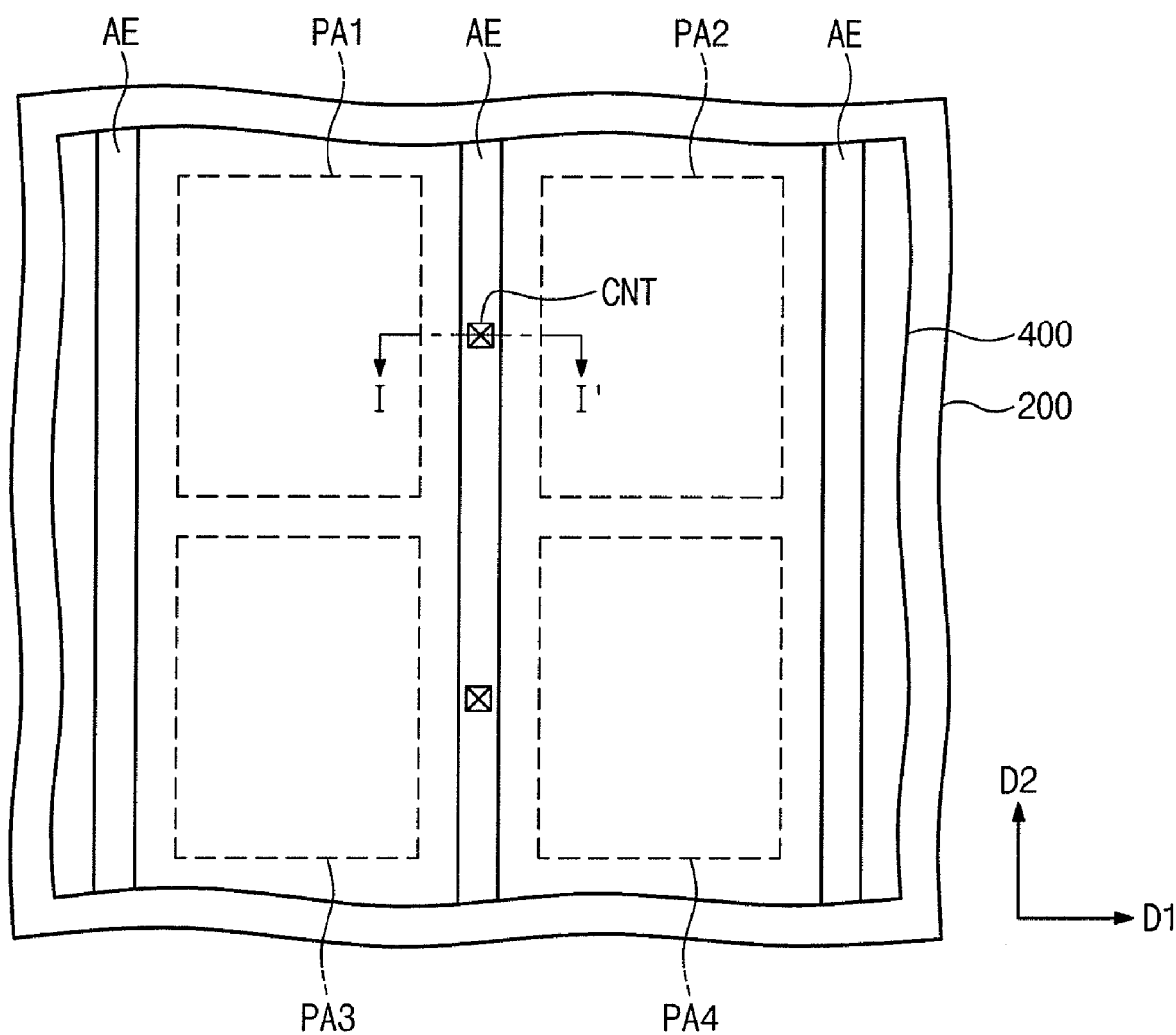
FIG. 1 is a plan view showing an organic light emitting display according to an exemplary embodiment of the present invention.

FIG. 1 is a plan view showing an organic light emitting display according to an exemplary embodiment of the present invention. In the present exemplary embodiment, the organic light emitting display includes a plurality of pixel areas, each of which having the same structure and functions.

Referring to FIG. 1, an organic light emitting display 500 includes a display substrate 200 and an opposite substrate 400 facing the display substrate 200. The organic light emitting display 500 includes a first pixel area PA1, a second pixel area PA2, a third pixel area PA3, and a fourth pixel area PA4. When viewed in a plan view, the first to fourth pixel areas PA1 to PA4 are arranged in a matrix configuration along a first direction D1 and a second direction D2 that is substantially perpendicular to the first direction D1. Four pixel areas PA1 to P4 are shown merely for ease of illustration, as the display 500 may include many pixel areas.

In the organic light emitting display 500, the first to fourth pixel areas PA1 to PA4 are areas through which light passes. The light emitted from an organic light emitting layer EL (shown in FIG. 2) of the display 500 may exit to an exterior after passing through the first to fourth pixel areas PA1 to PA4.

A sub-electrode AE that extends in the second direction D2 is arranged on the opposite substrate 400. Since the sub-electrode AE is arranged between adjacent pixel areas and does not overlap the first to fourth pixel areas PA1 to PA4 in a plan view, the light may exit to the exterior after passing through the first to fourth pixel areas PA1 to PA4 without being blocked by the sub-electrode AE. In addition, the sub-electrode AE is electrically connected to a second electrode 180 (shown in FIG. 2) through a contact portion CNT.

In the present exemplary embodiment, the sub-electrode AE has a shape that extends in the second direction D2. However, the sub-electrode AE may have various shapes. For example, the sub-electrode AE may extend in the first direction D1, or have a grid shape in which the sub-electrode AE extends in both the first direction D1 and the second direction D2. In addition, the sub-electrode may include a plurality of sub-electrodes that are spaced apart from each other and electrically connected to the second electrode 180.

Figure 2:
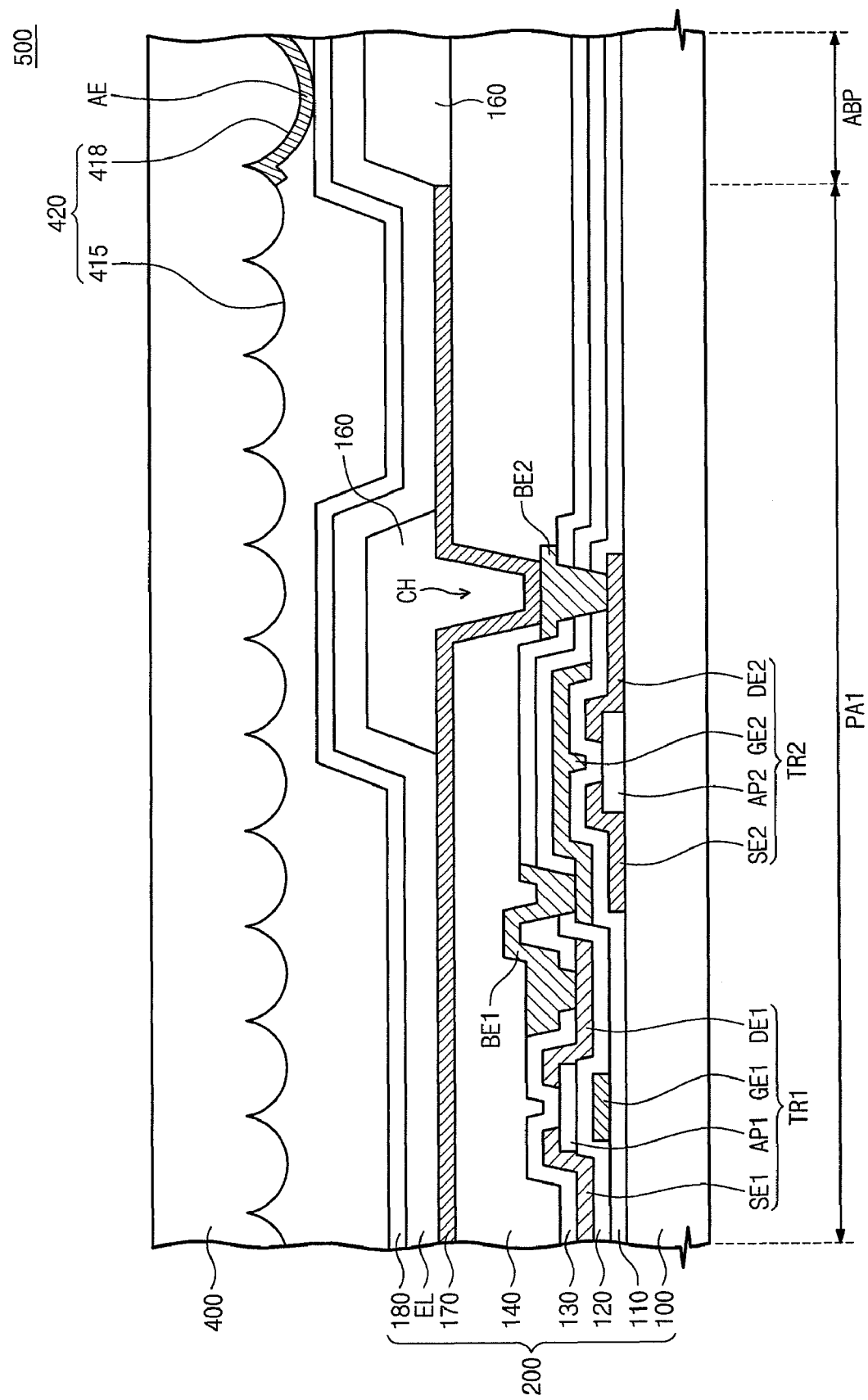
FIG. 2 is a cross-sectional view showing an organic light emitting display of FIG. 1.

FIG. 2 is a cross-sectional view showing the organic light emitting display of FIG. 1. FIG. 2 shows an embodiment of a pixel corresponding to the first pixel area PA1 (shown in FIG. 1), which will be used to describe the pixel structure and a light emitting function of the organic light emitting display. The organic light emitting display includes a plurality of pixels corresponding to the pixel areas in a one-to-one correspondence. However, since the pixels have the same structure, only one pixel will be illustrated in FIG. 2, and thus the detailed descriptions of others will be omitted.

The organic light emitting display 500 includes the display substrate 200 and the opposite substrate 400. The display substrate 200 includes a base substrate 100, a switching transistor TR1, a driving transistor TR2, an over-coat layer 140, a bank pattern 160, a first electrode 170, the organic light emitting layer EL, and the second electrode 180.

The switching transistor TR1 is arranged on the base substrate 100 and includes a first gate electrode GE1, a first source electrode SE1, a first drain electrode DE1, and a first active pattern AP1. Although not shown in FIG. 2, a gate line (not shown) transmitting a gate signal is arranged on the base substrate 100, and the first gate electrode GE1 branches from the gate line. In addition, a data line DL (shown in FIG. 3) insulated from the gate line and transmitting a data signal is arranged on the gate line, and the first source electrode SE1 branches from the data line. Thus, when the switching transistor TR1 is turned on in response to the gate signal, the data signal is transmitted to the first drain electrode DE1 through the first active pattern AP1.

The driving transistor TR2 includes a second gate electrode GE2, a second source electrode SE2, a second drain electrode DE2, and a second active pattern AP2. Although not shown in FIG. 2, a power supply line (not shown) transmitting a power voltage is arranged on the base substrate 100, and the second source electrode SE2 branches from the power supply line.

The second gate electrode GE2 is electrically connected to the first drain electrode DE1 by a first connection electrode BE1. Thus, when the switching transistor TR1 is turned on, the data signal is transmitted from the first drain electrode DE1 to the second gate electrode GE2 through the first connection electrode BE1. As a result, the driving transistor TR2 is turned on and the power voltage is transmitted to the second drain electrode DE2 through the second source electrode SE2 and the second active pattern AP2.

A first insulating layer 110 is arranged on the base substrate 100 to cover the second active pattern AP2, the second source electrode SE2, and the second drain electrode DE2. A second insulating layer 120 is arranged on the first insulating layer 110 to cover the first gate electrode GE1. A third insulating layer 130 is arranged on the second insulating layer 120 to cover the first source electrode SE1, the first drain electrode DE1, and the second gate electrode GE2.

The over-coat layer 140 is arranged on the switching transistor TR1 and the driving transistor TR2 to cover the switching transistor TR1 and the driving transistor TR2. Since an upper surface of the over-coat layer 140 may have a substantially flat shape, the first electrode 170 may be easily formed on the over-coat layer 140.

The first electrode 170 is arranged on the over-coat layer 140 in the first pixel area PA1, and the first electrode 170 is electrically connected to the second drain electrode DE2 by a second connection electrode BE2 exposed through a contact hole CH.

The bank pattern 160 is arranged on the over-coat layer 140. The bank pattern 160 is removed in the first pixel area PA1 except an area where the contact hole CH is formed, so that the first electrode 170 may make contact with the organic light emitting layer EL. In addition, the bank pattern 160 is arranged in an area between adjacent pixels ABP (hereinafter, referred to as "pixel gap area").

The organic light emitting layer EL may be arranged on a surface of the base substrate 100. The organic light emitting layer EL may be arranged substantially or entirely on the surface of the base substrate 100. The organic light emitting layer EL is arranged in the first pixel area PA1 and the pixel gap area ABP. Thus, the organic light emitting layer EL is arranged on the first electrode 170 in an area from which the bank pattern 160 is removed and arranged on the bank pattern 160 in the pixel gap area. The organic light emitting layer EL emits light using a current provided through the first electrode 170 and the second electrode 180.

The second electrode 180 is arranged on the organic light emitting layer EL. The second electrode 180 includes a transparent conductive material, such as indium tin oxide or indium zinc oxide. Thus, the light emitted from the organic light emitting layer EL may pass through the second electrode 180 to exit the exterior.

The opposite substrate 400 is coupled with the display substrate 200 to face the display substrate 200. The opposite substrate 400 may be, for example, a glass substrate. Micro-lenses 420 are formed on a surface of the opposite substrate 400. The micro-lenses 420 protrude from the surface and are integrally formed with the opposite substrate 400. The micro-lenses 420 disperse the light emitting from the organic light emitting layer EL and exiting to the exterior after passing through the opposite substrate 400.

The light emitted from a conventional organic light emitting layer EL may cause a multiple-beam interference phenomenon. In addition, the light may be constructively interfered by its resonance in a certain wavelength range, and destructively interfered in a wavelength range outside the certain wavelength range. As a result, the brightness of the organic light emitting display 500 may vary depending on a viewing angle. However, in the present exemplary embodiment, the micro-lenses 420 disperse the light emitting from the organic light emitting layer EL and exiting to the exterior after passing through the opposite substrate 400, thereby reducing or preventing variation in the brightness of the organic light emitting display 500 due to the viewing angle.

The micro-lenses 420 may be classified into first micro-lenses 415 and second micro-lenses 418 depending on their position and size. The first micro-lenses 415 are arranged corresponding to the first pixel area PA1, and the second micro-lenses 418 are arranged corresponding to the pixel gap area ABP.

The sub-electrode AE is arranged on the second micro-lenses 418. The sub-electrode AE may include a metallic material such as aluminum. The sub-electrode AE makes contact with the second electrode 180 in the pixel gap area ABP to be electrically connected to the second electrode 180.

Figure 3:
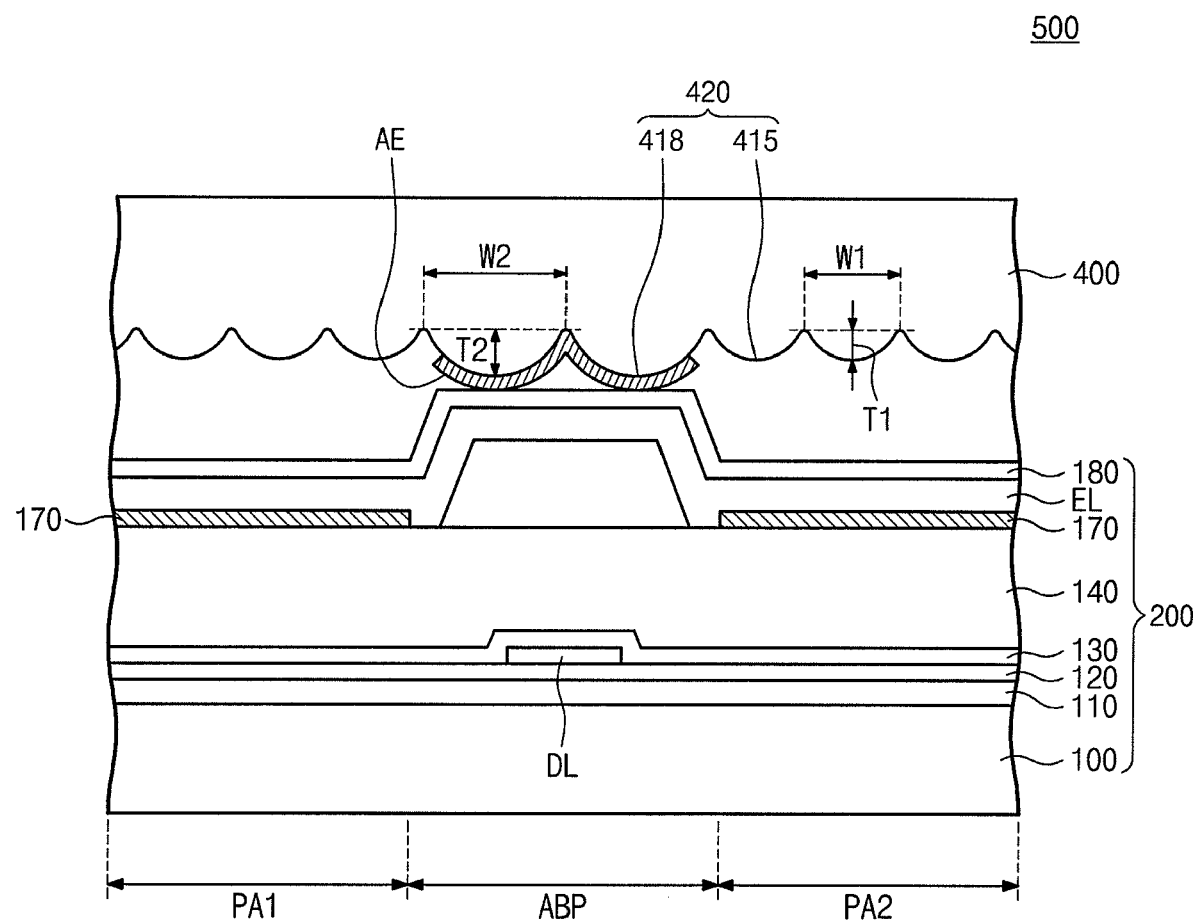
FIG. 3 is a cross-sectional view taken along a line I-I' of FIG. 1.

FIG. 3 is a cross-sectional view taken along a line I-I' of FIG. 1. In FIG. 3, cross sections show structures corresponding to the first pixel area PA1, the second pixel area PA2, and the pixel gap area ABP between the first and second pixel areas PA1 and PA2 of the organic light emitting display 500.

Referring to FIG. 3, the data line DL is arranged between the second insulating layer 120 and the third insulating layer 130 on the base substrate 100 corresponding to the pixel gap area ABP, and the first electrode 170 is arranged on the over-coat layer 140 corresponding to each of the first pixel area PA1 and the second pixel area PA2.

The micro-lenses 420 are arranged on the opposite substrate 400. More particularly, the first micro-lenses 415 are arranged on the opposite substrate 400 corresponding to the first and second pixel areas PA1 and PA2, and the second micro-lenses 418 are arranged on the opposite substrate 400 corresponding to the pixel gap area ABP.

Each of the first micro-lenses 415 has a first width W1 and a first thickness T1. Each of the second micro-lenses 418 has a second width W2 wider than the first width and a second thickness T2 thicker than the first thickness T1.

The sub-electrode AE is arranged on the second micro-lenses 418. The sub-electrode AE including the metallic material does not block the light emitted from the organic light emitting layer EL that is formed on the first and second pixel areas PA1 and PA2. The sub-electrode AE may have a convex-concave shape corresponding to the second micro-lenses 418 that has a convex shape toward the second electrode 180.

The sub-electrode AE is electrically connected to the second electrode 180 in the pixel gap area ABP to decrease an electrical resistance of the second electrode 180. The second electrode 180 is formed with a thin thickness to increase the amount of the light emitting from the organic light emitting layer EL and exiting to the exterior after passing through the second electrode 180. However, this thin thickness may increase the electrical resistance of the second electrode 180. The increase in electrical resistance of the second electrode 180 may be reduced or prevented by the sub-electrode AE. An electrical conductivity of the second electrode 180 may be improved by the sub-electrode AE, so that the electrical current may more easily flow through the second electrode 180, thereby improving a display quality of the organic light emitting display 500.

Since the second micro-lenses 418 make contact with the second electrode 180 while interposing the sub-electrode AE between the second electrode 180 and the second micro-lenses 418, the second micro-lenses 418 may maintain a distance between the display substrate 200 and the opposite substrate 400. Thus, the second micro-lenses 418 prevent the opposite substrate 400 from directly making contact with the display apparatus 200, and thus deterioration in a light emit-ting function of the organic light emitting display 500, caused by a pressure applied locally to the display apparatus 200, may be prevented.

FIGS. 4 to 9 are cross-sectional views showing a manufacturing process of the organic light emitting display of FIG. 3 according to an exemplary embodiment of the present invention. In FIGS. 4 to 9, the same reference numerals denote the same elements in FIGS. 1 to 3, and thus detailed descriptions of the same elements will be omitted.

Figure 4:
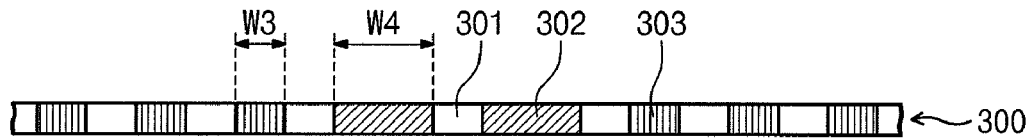
FIGS. 4 to 9 are cross-sectional views showing a manufacturing process of an organic light emitting display of FIG. 3 according to an exemplary embodiment of the present invention.
Figure 4:
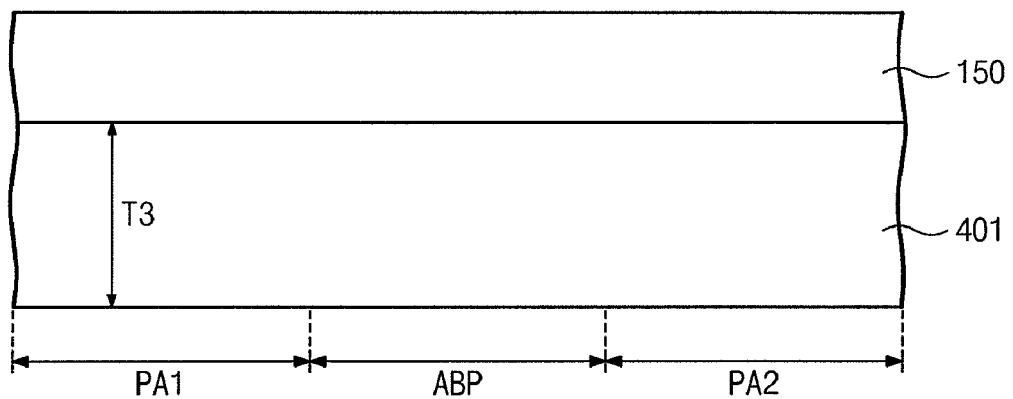
Figure 5:
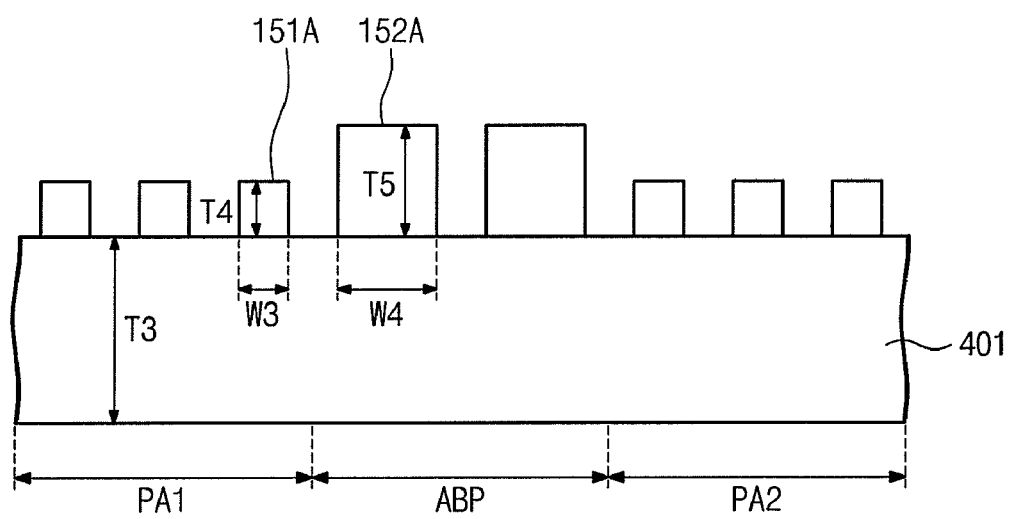

Referring to FIGS. 4 and 5, a preliminary substrate 401 is prepared and a positive photoresist is deposited on the preliminary substrate 401 to form a photoresist layer 150 on a surface of the preliminary substrate 401. The photoresist layer 150 may be formed substantially or entirely on the surface of the preliminary substrate 401. The preliminary substrate 401 may include a glass material and has a third thickness T3. After forming the photoresist layer 150 on the preliminary substrate 401, a photomask 300 is arranged above the photoresist layer 150, and the photoresist layer 150 is exposed to a light using the photomask 300 with a predetermined pattern. The photomask 300 may be, for example, a slit mask or a half-tone mask.

The photomask 300 includes transmission regions 301, non-transmission regions 302, and semi-transmission regions 303. The transmission regions 301 transmit light, and the non-transmission regions 302 block light. The semi-transmission regions 303 also transmit light, however, each of the semi-transmission regions 303 has a lower light transmittance than that of each of the transmission regions 301.

The semi-transmission regions 303 are arranged corresponding to the first pixel area PA1 and the second pixel area PA2 in the photomask 300, and each of the semi-transmission regions 303 has a third width W3. The non-transmission regions 302 are arranged corresponding to the pixel gap area ABP in the photomask 300, and each of the non-transmission regions 302 has a fourth width W4 that is wider than the third width W3.

After exposing the photoresist layer 150 to the light using the photomask 300, the photoresist layer 150 is developed to form first photoresist layer patterns 151A and second photoresist layer patterns 152A on the preliminary substrate 401. Areas of the photoresist layer 150 corresponding to the transmission regions 301 are completely removed. The first photoresist layer patterns 151A may be formed corresponding to the semi-transmission regions 303 in a one-to-one correspondence, and the second photoresist layer patterns 152A may be formed corresponding to the non-transmission regions 302 in a one-to-one correspondence.

Each of the first photoresist layer patterns 151A may have a width that is narrower than that of each of the second photoresist layer patterns 152A. In addition, each of the first photoresist layer patterns 151A has a fourth thickness T4, and each of the second photoresist layer patterns 152A has a fifth thickness T5 that may be thicker than the fourth thickness T4.

Figure 6:
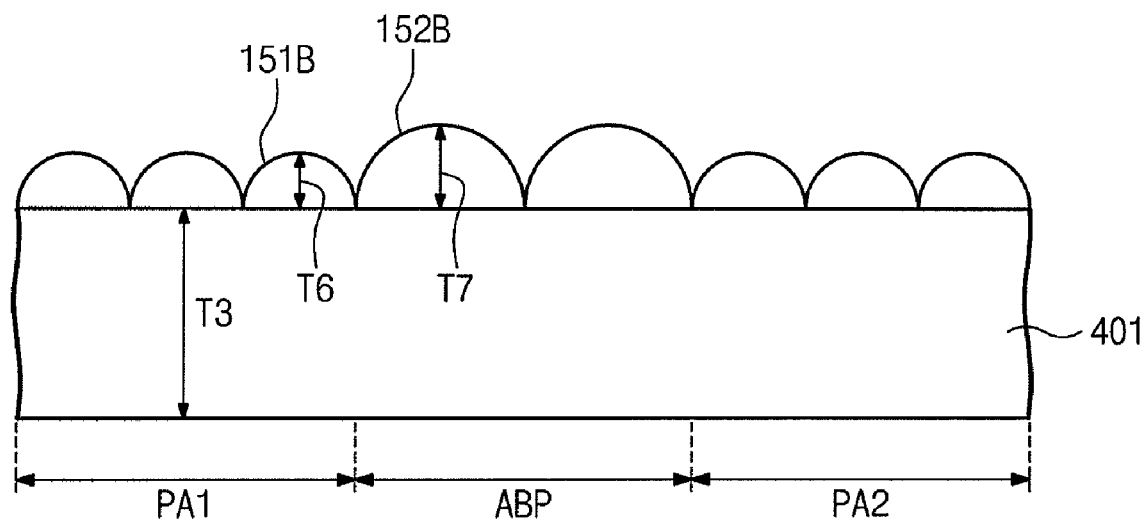
Figure 7:
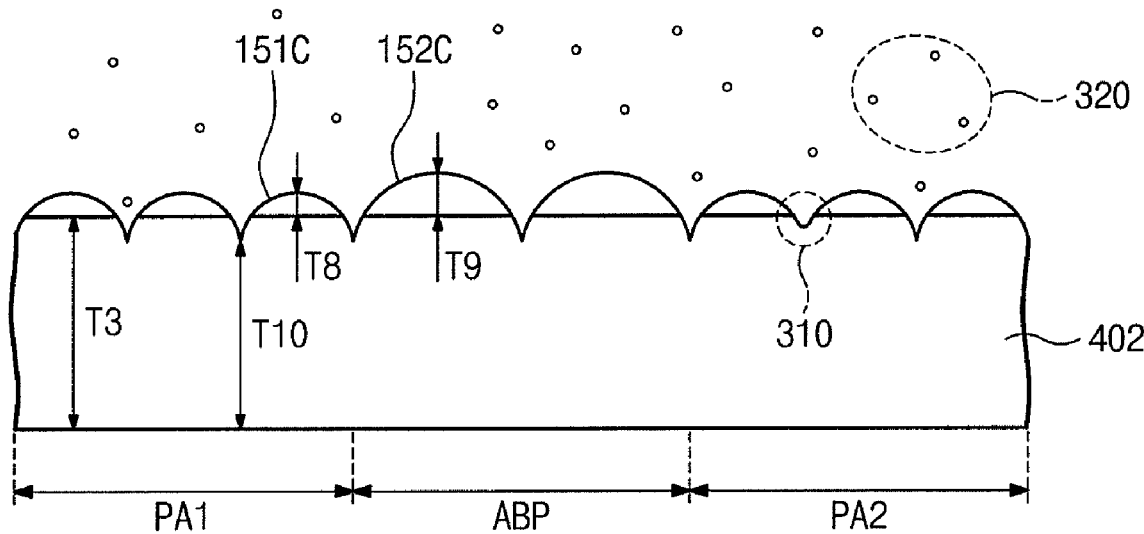
Figure 8:
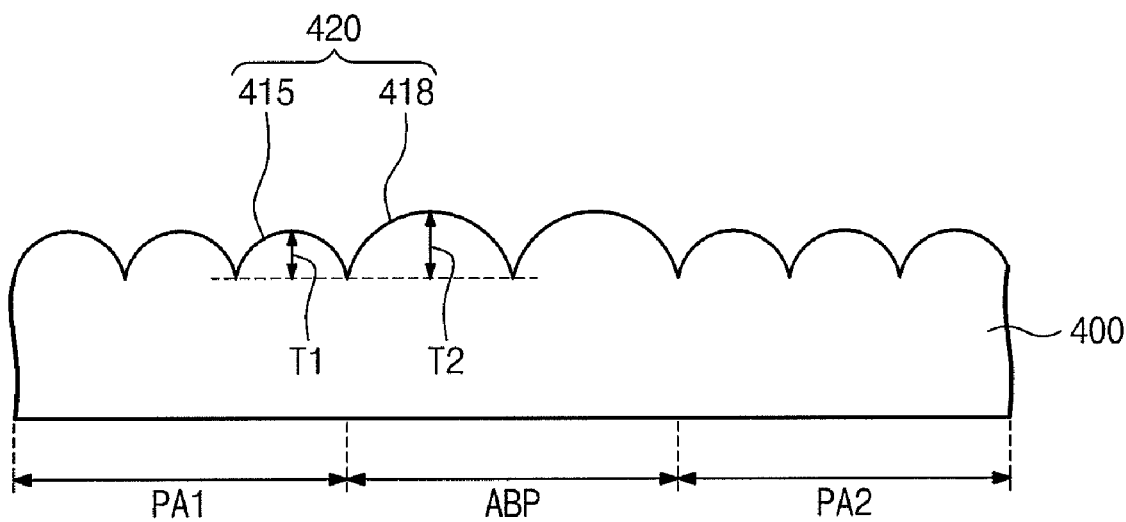

Referring to FIGS. 6 to 8, the first photoresist layer patterns 151A (shown in FIG. 5) and the second photoresist layer patterns 152A (shown in FIG. 5) formed on the preliminary substrate 401 are reflowed by heat. Thus, the first photoresist layer patterns 151A are reflowed to form first protruding portions 151B having a sixth thickness T6, and the second photoresist layer patterns 152A are reflowed to form second protruding portions 152B having a seventh thickness T7. Each of the first protruding portions 151B has a shape corresponding to that of each of the first micro-lenses 415 (shown in FIG. 1), and each of the second protruding portions 152B has a shape corresponding to that of each of the second micro-lenses 418 (shown in FIG. 2).

After forming the first and second protruding portions 151B and 152B on the preliminary substrate 401, shapes of the first and second protruding portions 151B and 152B are transferred to the preliminary substrate 401 to form a second substrate 400 having the first and second micro-lenses 415 and 418.

A method of manufacturing the second substrate 400 on which the shape of the first and second protruding portions 151B and 152B are transferred will be described in detail with reference to FIGS. 6, 7 and 8, according to an exemplary embodiment of the present invention.

The preliminary substrate 401 on which the first and second protruding portions 151B and 152B are formed is etched by a reactive ion etching (RIE) method using an etchant 320. The preliminary substrate 401 may have substantially the same etch selectivity as that of the first and second protruding portions 151B and 152B with respect to the etchant 320. For example, a mixed gas of oxygen and trifluoromethane ($CHF_3$) may be used for the etchant 320.

During the reactive ion etching process using the etchant 320, the first protruding portions 151B are etched by the etchant 320 to form first etch patterns 151C having an eighth thickness T8 that may be thinner than the sixth thickness T6, and the second protruding portions 152B are etched by the etchant 320 to form second etch patterns 152C having a ninth thickness T9 that may be thinner than the seventh thickness T7. As the first and second protruding portions 151B and 152B are etched, an area of the preliminary substrate 401 exposed to the exterior becomes larger. As a result, the exposed area 310 of the preliminary substrate 401 is partially etched by the etchant 320.

For the convenience of explanation, the substrate in the reactive ion etching process shown in FIG. 7 will be referred to as a preliminary opposite substrate 402. Portions of the preliminary opposite substrate 402 covered by the first and second etch patterns 151C and 152C have the third thickness T3, and portions of the opposite substrate 402 exposed to the exterior have a tenth thickness T10 that may be thinner than the third thickness T3.

As shown in FIG. 8, when the first and second etch patterns 151C and 152C are completely removed, the opposite substrate 400 on which the micro-lenses 420 including the first and second micro-lenses 415 and 418 are formed is completed.

Figure 9:
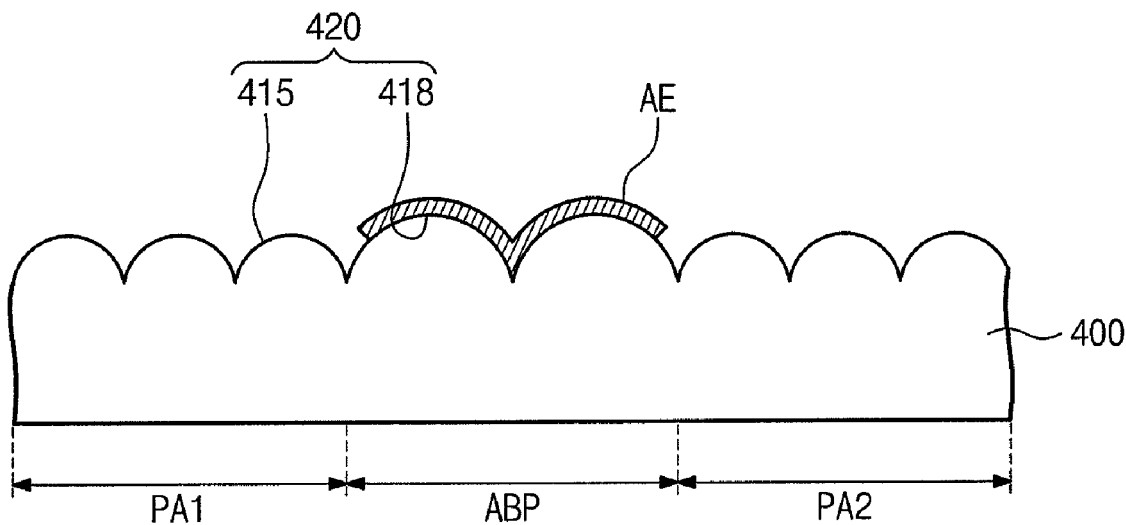

Referring to FIG. 9, the sub-electrode AE is formed on the second micro-lenses 418. The sub-electrode AE may be formed by forming a metal layer (not shown), e.g. aluminum layer, on the opposite substrate 400 and patterning the metal layer such that the metal layer is deposited only on the second micro-lenses 418.

Referring again to FIG. 3, after forming the sub-electrode AE on the second micro-lenses 418, the display substrate 200 is coupled with the opposite substrate 400, so that the sub-electrode AE may make contact with the second electrode 180 in the pixel gap area ABP. Thus, the sub-electrode AE is electrically connected to the second electrode 180.

In addition, since the second micro-lenses 418 make contact with the second electrode 180 while interposing the sub-electrode AE therebetween in the pixel gap area ABP, the second micro-lenses 418 may serve as the spacer that maintains the distance between the display substrate 200 and the opposite substrate 400.

According to at least one exemplary embodiment of the present invention, a first electrode, a organic light emitting layer, and a second electrode are arranged on a base substrate, and micro-lenses are arranged on an opposite substrate. The micro-lenses disperse light that is emitted by the organic light emitting layer and exits to an exterior after passing through the opposite substrate, thereby preventing the brightness of the organic light emitting display from varying according to a viewing angle. The micro-lenses may also serve as a spacer that maintains a distance between the base substrate and the opposite substrate. For example, a distance between the base substrate and the opposite substrate may be increased by increasing the thicknesses of the micro-lenses. In addition, the sub-electrode formed on the micro-lenses may be electrically connected to the second electrode.

Although exemplary embodiments of the present invention have been described, it is understood that the present invention should not be limited to these exemplary embodiments, and various changes and modifications can be made by one ordinary skilled in the art within the spirit and scope of the disclosure.

What is claimed is:

1. An organic light emitting display comprising:
   a base substrate;
   a driving transistor arranged on the base substrate;
   a first electrode electrically connected to the driving transistor;
   an organic light emitting layer arranged on the first electrode to generate a light;
   a second electrode arranged on the organic light emitting layer;
   an opposite substrate facing the base substrate and including micro-lenses to disperse the light generated by the organic light emitting layer, wherein at least one of the micro-lenses has a thickness that differs from another one of the micro-lenses; and
   a sub-electrode arranged on at least one of the micro-lenses, the sub-electrode making contact with the second electrode to be electrically connected to the second electrode
   wherein the base substrate comprises a plurality of pixel areas, the first electrode is arranged in each pixel area, and the sub-electrode is arranged between adjacent pixel areas in a plan view,
   wherein the micro-lenses comprise:
   first micro-lenses protruding from the opposite substrate and each corresponding to a respective one of the pixel areas, wherein each of the first micro-lenses has a first thickness; and
   second micro-lenses protruding from the opposite substrate and corresponding to areas between adjacent pixel areas, wherein each of the second micro-lenses has a second thickness that is thicker than the first thickness, and wherein the sub-electrode is arranged on the second micro-lenses.

2. The organic light emitting display of claim 1, wherein each of the micro-lenses has a convex shape toward the second electrode.

3. The organic light emitting display of claim 1, wherein the sub-electrode comprises a metallic material.

4. The organic light emitting display of claim 1, wherein the organic light emitting layer is arranged on an entire surface of the base substrate.

5. A substrate opposing a display substrate of an organic light emitting display, the opposing substrate comprising:
   a transparent substrate, wherein one surface of the transparent substrate includes a first plurality of lenses disposed to face respective pixel areas of the display substrate and a second plurality of lenses disposed to face respective spaces between the pixel areas, wherein the first plurality of lenses have a different thickness from the second plurality of lenses; and a plurality of sub-electrodes contacting with and covering a part of a respective one of the second plurality of lenses, wherein the sub-electrodes are configured to make an electrical connection with a transparent conductive material of the display substrate.

6. The opposing substrate of claim 5, wherein the lenses have a convex shape toward the display substrate.

7. The opposing substrate of claim 5, wherein the sub-electrodes have a convex-concave shape.

8. The opposing substrate of claim 5, wherein the thickness of the second plurality of lenses is greater than the thickness of the first plurality of lenses.

9. The opposing substrate of claim 5, wherein the width of the second plurality of lenses is greater than the width of the first plurality of lenses.

* * * * *